(12) United States Patent
Heintel et al.

(10) Patent No.: US 10,663,873 B2
(45) Date of Patent: May 26, 2020

(54) MIRROR ARRANGEMENT FOR MICROLITHOGRAPHIC PROJECTION EXPOSURE APPARATUS AND RELATED METHOD

(71) Applicant: Carl Zeiss SMT GmbH, Oberkochen (DE)

(72) Inventors: Willi Heintel, Aalen (DE); Hermann Bieg, Huettlingen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 492 days.

(21) Appl. No.: 15/393,702

(22) Filed: Dec. 29, 2016

(65) Prior Publication Data
US 2017/0108788 A1   Apr. 20, 2017

Related U.S. Application Data

(63) Continuation of application No. PCT/EP2015/068997, filed on Aug. 19, 2015.

(30) Foreign Application Priority Data

Sep. 30, 2014   (DE) ........................ 10 2014 219 770

(51) Int. Cl.
*G03F 7/20* (2006.01)
*G02B 7/18* (2006.01)
*G02B 7/182* (2006.01)

(52) U.S. Cl.
CPC ......... *G03F 7/70891* (2013.01); *G02B 7/182* (2013.01); *G02B 7/1815* (2013.01);
(Continued)

(58) Field of Classification Search
CPC ........ G02B 5/09; G02B 5/10; G02B 26/0833; G02B 26/0841; G02B 26/0816;
(Continued)

(56) References Cited

U.S. PATENT DOCUMENTS 5,524,131 A   6/1996   Uzawa et al.
6,359,678 B1   3/2002   Ota
(Continued)

FOREIGN PATENT DOCUMENTS

DE         103 026 64 A1   7/2004
DE    10 2008 049 556 A1   4/2010
(Continued)

OTHER PUBLICATIONS

International Search Report and Written Opinion for corresponding PCT Appl No. PCT/EP2015/068997 dated Nov. 9, 2015.
(Continued)

*Primary Examiner* — Thomas K Pham
*Assistant Examiner* — Sharrief I Broome
(74) *Attorney, Agent, or Firm* — Fish & Richardson P.C.

(57) ABSTRACT

A mirror arrangement, in particular for a microlithographic projection exposure apparatus, includes at least one mirror element bearing a mirror surface provided for reflecting electromagnetic radiation, at least one carrier element including a head section, which is provided for receiving at least one mirror element, and also a seat section. The arrangement further includes a mount arrangement, for receiving the at least one carrier element. At least one insertion opening is in the mount arrangement. The seat section of the carrier element plunges into the insertion opening. In addition, the arrangement includes a channel device for guiding a heat transfer medium is formed in the mount arrangement in the region surrounding the seat section. A method for dissipating heat is provided.

26 Claims, 7 Drawing Sheets

(52) U.S. Cl.
CPC ...... *G03F 7/70075* (2013.01); *G03F 7/70116* (2013.01); *G03F 7/70825* (2013.01)

(58) Field of Classification Search
CPC .......... G02B 3/08; G02B 7/182; G02B 7/183; G02B 19/0028; G02B 19/0042; G02B 5/045; G02B 5/124; G02B 17/002; G02B 17/0663; G02B 17/08; G02B 17/0896; G02B 2027/0125; G02B 21/04; G02B 21/34; G02B 26/02; G03F 7/702; G03F 7/70075; G03F 7/70233; G03F 7/70108; G03F 7/70116; G03F 7/70191; G03F 7/70825; G03F 7/70083; G03F 7/70141; G03F 7/70891; G03F 7/70008; G03F 7/70058; G03F 7/70158; G03F 7/70166; G03F 7/70175; G03F 7/70258; G03F 7/70291; G03F 7/70308; G03F 7/70575; G03F 7/7085
See application file for complete search history.

(56) References Cited

U.S. PATENT DOCUMENTS

| | | | |
|---|---|---|---|
| 7,349,063 B2 | 3/2008 | Miyajima | |
| 2005/0128446 A1 | 6/2005 | Miyajima | |
| 2007/0206301 A1 | 9/2007 | Seifert et al. | |
| 2009/0103063 A1 | 4/2009 | Nishikawa | |
| 2013/0100429 A1* | 4/2013 | Fiolka | G02B 26/06 |
| | | | 355/67 |
| 2013/0176544 A1* | 7/2013 | Hauf | G02B 7/181 |
| | | | 355/30 |
| 2014/0071523 A1* | 3/2014 | Hartjes | G02B 7/1815 |
| | | | 359/359 |
| 2014/0333912 A1 | 11/2014 | Bleidistel et al. | |
| 2016/0097914 A1* | 4/2016 | Trail | G02B 23/06 |
| | | | 356/510 |

FOREIGN PATENT DOCUMENTS

| | | | |
|---|---|---|---|
| DE | 10 2011 005 778 A1 | 9/2012 | |
| DE | 10 2012 200 733 A1 | 1/2013 | |
| DE | 10 2012 200 732 A1 | 2/2013 | |
| DE | 10 2012 200732 * | 2/2013 | ............ G02B 7/182 |
| DE | 10 2012 200732 A1 | 2/2013 | |
| DE | 10 2013 205 214 A1 | 3/2014 | |
| JP | H02-100311 A | 4/1990 | |
| JP | H11-243052 A | 9/1999 | |
| JP | 2005-175187 A | 6/2005 | |
| JP | 2011-176044 A | 9/2011 | |
| JP | 2012-191040 A | 10/2012 | |
| TW | 200403543 A | 6/1992 | |
| TW | 200931194 A | 7/2009 | |
| WO | WO 2012/000528 A1 | 1/2012 | |
| WO | WO 2012/166204 A1 | 12/2012 | |
| WO | WO 2013/107762 | 7/2013 | |

OTHER PUBLICATIONS

German Office Action, with translation thereof, for corresponding DE Appl No. 10 2014 219 770.8, dated Jun. 3, 2015.
International Preliminary Report on Patentability for corresponding PCT Appl No. PCT/EP2015/068997 dated Apr. 27, 2017.
JP-Office Action, with translation thereof, for corresponding JP Appl No. 2017-513203 dated Jul. 8, 2019.
TW—Office Action and Search Report, with translation thereof, for corresponding TW Appl No. 104127528, dated Jan. 14, 2020.

* cited by examiner

MIRROR ARRANGEMENT FOR MICROLITHOGRAPHIC PROJECTION EXPOSURE APPARATUS AND RELATED METHOD

CROSS-REFERENCE TO RELATED APPLICATIONS

The present application is a continuation of, and claims benefit under 35 USC 120 to, international application PCT/EP2015/068997, filed Aug. 19, 2015, which claims benefit under 35 USC 119 of German Application No. 10 2014 219 770.8, filed Sep. 30, 2014. The entire disclosure of international application PCT/EP2015/068997 and German Application No. 10 2014 219 770.8 are incorporated by reference herein.

FIELD

The disclosure relates to a mirror arrangement, in particular for a lithographic projection exposure apparatus. In particular, the disclosure in this case relates to a mirror arrangement that combines a plurality of mirror elements each bearing a mirror array to form a correspondingly large-area, in particular concave, mirror system, for reflecting light having a wavelength in the extreme ultraviolet spectral range, wherein the optically active region of those mirror components is surrounded by an atmosphere having a low particle density. Furthermore, the disclosure relates to a method for dissipating a heat flow from the region of a mirror arrangement of the abovementioned type.

BACKGROUND

Lithographic projection exposure apparatuses, such as are used for producing integrated electrical circuits and other microstructured components, image structures contained in a reticle onto a light-sensitive layer generally in a reduced manner, which light-sensitive layer can be applied e.g. on a silicon wafer. One exemplary construction for such a projection exposure apparatus is known from DE 10302664 A1.

One of the major aims in the development of projection exposure apparatuses consists in being able to lithographically define structures with increasingly smaller dimensions on the light-sensitive layer. The higher integration densities possible as a result for the microstructured components produced with the aid of such apparatuses generally considerably increase the performance of the components. The production of particularly small structure sizes presupposes a high resolution capability of the projection systems used. Since the resolution capability of the projection systems is inversely proportional to the wavelength of the projection light, successive product generations of such projection exposure apparatuses use projection light having ever shorter wavelengths. Current developments are directed to the development of projection exposure apparatuses which use projection light having a wavelength in the extreme ultraviolet spectral range (EUV). In particular wavelengths of between 1 nm and 30 nm, and in particular the wavelength of 13.5 nm, are taken into consideration in this case.

For guiding the light emitted by a suitable light source in the beam path of a projection system it is possible to use mirror arrangements including a plurality of mirror arrays, wherein each mirror array has a multiplicity of closely adjacent, relatively small-area mirror facets whose optical alignment is variable in a controlled manner in each case by themselves or in defined groups. The mirror facets can heat up greatly in the context of operation of a corresponding projection system owing to the light which impinges on the mirror facets and is partly absorbed here, and also as a result of the inherent power consumption of the mirror adjusting devices assigned to the respective mirror facets. The heating can lead to undesirable effects such as e.g., deformations of the mirror arrays, of the mirror facets or of the entire mirror system. Moreover, high temperatures can damage the sensitive reflective layers of the mirror system. In this case, DE 102013205214 A1 discloses dissipating the heat arising in the region surrounding the mirror facets by means of a gas flow.

SUMMARY

The disclosure seeks to make it possible, in the case of a mirror arrangement including a plurality of mirror elements, to ensure moderate temperatures of the mirror elements even in the case of high heat input.

In one general aspect, a mirror arrangement includes:
- at least one mirror element bearing a mirror surface provided for reflecting electromagnetic radiation;
- at least one carrier element including a head section, which is provided for receiving at least one mirror element, and also a seat section; and
- a mount arrangement, for receiving the at least one carrier element, wherein:
- at least one insertion opening is formed in the mount arrangement;
- the seat section of the carrier element plunges into the insertion opening; and
- a channel device for guiding a heat transfer medium is formed in the mount arrangement in the region surrounding the seat section.

This makes it possible to provide a mirror arrangement for an EUV projection exposure apparatus in which an effective dissipation of the heat arising in the region of a mirror element is made possible and, in addition, the mirror element can be combined with a carrier element to form an assembly which can advantageously be linked into the mount arrangement or if desired also be removed from the latter.

The temperature of the cooling medium guided through the mirror arrangement can be coordinated such that it substantially corresponds to the setpoint temperature of the mirror arrangement and the temperature gradient for realizing the heat flow substantially results from the locally higher system temperature in the region of the mirror elements or the adjoining region of the respective carrier element. The cooling capacity can then primarily be coordinated by means of the coordination of the flow of the cooling medium.

In accordance with a further advantageous embodiment of the mirror arrangement, the carrier element is formed as a pin-like component, wherein the seat section tapers in the insertion direction. In this case, the seat section can be fashioned such that it has a cone-shape, i.e. conical, outer surface. In this case, the cone angle can be defined such that a relatively high compression between the conically extending outer circumferential surface of the seat section and the inner wall of the mount arrangement that contacts the surface arises for moderate axial forces.

The cone-shaped or conical outer surface can be fashioned geometrically such that as intimate contacting of the seat section and the inner wall of the insertion opening as possible arises when the installation position is attained, in particular under the action of the mounting forces established in this case. For this purpose, in the region of the seat section at least in sections elastically and/or plastically deformable structures can be formed which ensure as intimate contacting of the inner wall of the insertion opening as possible and themselves cause the smallest possible heat transfer resistances. For this purpose, a coating including at least one material layer can be applied to the carrier element in the region of the seat section, for example, the coating plastically deforming when the mounting forces are attained in such a way that it brings about a particularly effective thermal coupling of the carrier element to the mount arrangement. The coating can be embodied in particular as a metallic coating and can be applied to the carrier element in the region of the seat section thereof e.g. electrochemically, in particular as an electrolytic coating. The coating can be embodied in particular as an indium-containing coating which is covered, if appropriate, with a further coating, in particular a gold or silver coating. The layer thickness of the coating is preferably in the range of 10 to 20 μm. Non-metallic ductile layers such as a Teflon layer, for example, can also lead to an improvement in the thermal contact. Furthermore, the seat surface can be fashioned such that on the inherently conical geometry a slightly wavy geometry is superimposed which has the effect that contact zones with high surface pressure arise after the mounting of the carrier element. It is also possible, in the region of the seat section, to provide grooves or other local small cutouts or depressions into which, if appropriate, portions of the plastically deformable coating can migrate, such that in the context of the fixing of the carrier element the plastically deformable coating is reduced to a layer thickness which largely fills the surface roughnesses and shape defects of the inner surface of the mount arrangement and the outer surface of the seat section and otherwise only has a residual thickness which causes no further displacement of the plastically deformable coating with the mounting force chosen.

Besides the above-described measure of forming a relatively ductile coating on the seat surface of the carrier element, it is also possible to form, in that region of the carrier element which forms the seat surface, elastically compliant structures, in particular radially compliant tongues, which are formed in close proximity to one another, preferably integrally with the carrier element. In the context of the mounting of the carrier element, the tongues are forced against the inner wall of the hole receiving the carrier element and then contact the inner wall with a contact force coordinated by the geometry of the tongues.

It is furthermore possible to form, in the region of the seat section, geometrical structures which generate locally increased surface pressures and thus have the effect that the carrier element is seated in the mount arrangement in a sealing manner. For sealing the component assembly, it is also possible to realize a sealing arrangement on an underside of the head section of the carrier element facing away from the respective mirror element. The sealing arrangement can include in particular a sealing ring structure which, in the context of the incorporation of the carrier element into the mount arrangement, is axially loaded and pressed in the process. In this case, the sealing material is preferably chosen such that it ensures that as little gas as possible is liberated. In this case, in particular, ductile metallic materials, and likewise in particular also composite structures composed of ductile metallic materials and elastomer materials and seals composed of pure elastomers are suitable as sealing material. Insofar as the underside of the head section cannot be used for realizing a sealing system, or else in combination with this approach, it is possible to provide, in the adjacent, i.e. upper, region of the cone, sealing structures which bring about a seal with use of substantially radially directed pressure forces. In this case, the sealing structures can in turn be formed by ring-like elements, for example O-rings. The sealing systems provided here can likewise preferably include plastically deformable metal structures, for example a gold, copper or aluminium wire seal. This sealing arrangement can also include seals having fabric structures and/or elastomeric elements, in particular O-rings. The sealing arrangement can also include a combination of metallic and elastomeric sealing members. Furthermore, it is possible to realize the sealing of the carrier elements in the mount arrangement by means of a plurality of successive sealing zones and to provide an intermediate extraction by suction or barrier gas admission between two sealing zones, such that no gas can enter the region of the mirror element from the lower mount region.

It is furthermore possible to provide channel structures in the inner region of the carrier element, via which channel structures a heat transfer based e.g. primarily on convection effects takes place within the carrier element. For this purpose, a so-called heat pipe system can be realized in the inner region of the carrier element, for example, in which system a heat transfer between the zone adjacent to the head section and the seat section is supported by a change in the state of matter of a heat transfer medium.

Preferably, a passage channel is formed in the carrier element, the passage channel extending through the seat section. Those connection and control lines which connect the actuator systems linked into the mirror elements to a corresponding electronic driving system can be led through the passage channel. What is achieved by means of the concept according to the disclosure is that the carrier elements provide a large heat conduction cross section in the heat input region despite the passage channel and an effective heat dissipation is thus ensured.

The inner wall of the respective insertion opening is formed by a bush element linked into the mount arrangement. In this case, the bush element can be linked into the mount arrangement in a sealing manner in such a way that the cooling system is not open even if the carrier element is removed from the insertion opening or has not yet been inserted into the latter. The bush element can be formed in particular as a relatively thin-walled hollow cone bush which is inserted into the mount arrangement, in particular soldered into the latter in a sealing manner. The bush element advantageously consists of the same material as that shell of the mount arrangement which receives the bush element.

The channel device provided for guiding the heat transfer medium can be provided for example by virtue of the fact that the channel device is formed at least in sections by a cutout extending in the region of the outer side of the hollow-cone-like bush element. As an alternative thereto or in combination with this concept, it is also possible to form corresponding groove structures provided for fluid guidance also in the main body forming the mount arrangement. The formation of the groove or channel structure in the bush element makes it possible to realize complex and filigree channel geometries and also affords advantages from production engineering standpoints.

The cooling medium is guided into the region surrounding the insertion opening preferably by means of a channel system formed directly in the mount arrangement, the channel system communicating with the channel device provided on the part of the bush element. The channel system formed in the mount arrangement can be fashioned such that parallel cooling of the regions surrounding a plurality of insertion openings is realized by means of the channel system. The fluid flow branching can be coordinated by switching or restricting members. Preferably, the channel system surrounding the respective bush element also forms a flow resistance that is higher than the flow resistance of the channel system provided for feeding in fluid, such that, in the case of a mount arrangement having a multiplicity of insertion openings, substantially identical fluid throughputs and thus identical cooling capacities can be realized at each insertion opening.

The channel device formed in the outer region of the respective bush element can be formed such that the channel device extends continuously around the bush element spirally or helically in the manner of a threaded furrow. The threaded furrow can also be formed such that it rises in multiple lead fashion. However, it is also possible for the channel device to be fashioned such that it branches or runs in some other way with the effect of flushing around or through the bush element as homogeneously as possible.

The carrier element, as already discussed above, is preferably inserted into the bush element in a sealing manner. As a result, it becomes possible to create a vacuum in the region receiving the mirror elements, without a gas inflow from the rear region of the mount arrangement taking place here via the joining region of the carrier elements.

The carrier element is furthermore preferably provided with a fixing section, wherein a holding force that secures the carrier element in the mount arrangement can be introduced into the carrier element via the fixing section. The fixing section can be embodied in particular as a threaded section on which a nut is seated, which generates that holding force in the tightened state. The diversion of the holding force generated on the part of the nut into the mount arrangement can be carried out in particular with the linking of a spring, in particular a disk spring, such that sufficiently high axial forces are always provided even in the event of thermal expansions of the mount arrangement or of the carrier elements. Preferably, in the region of the mount arrangement, geometrical structures, for example in the form of a thread or a ring-like recess, are provided which make it possible to attach there a release mechanism serving for the possibly desired demounting of the carrier element. The release mechanism can include in particular a threaded bush which can be screwed into the mount arrangement as desired "from below" and enables the carrier element to be pressed out of the mount arrangement.

The mirror element is preferably formed as a block- or parallelepiped-like component. This component is preferably connected to the carrier element in such a way as to result in an effective heat transfer between these components. For this purpose, in particular, structures can also be formed in the mirror element, which structures promote the heat transfer from the region of the mirror facets into the deeper region of the mirror element. The coupling of the mirror element to the carrier element can be realized in particular by welding, soldering, adhesive bonding or else by mechanical connection structures, e.g. clamping, wedging or other joining, preferably with an intimate planar bearing of the two components being brought about.

Furthermore, a rotation securing means can be provided in order to secure the rotational position. The rotation securing means can include a pin or a ball, for example, which engages into a corresponding receptacle such as a slot or the like.

The carrier element is geometrically coordinated such that it provides the largest possible cross section sufficient for the heat transfer in particular in that region which plunges into the mount arrangement. A material having a good thermal conductivity and a moderate, preferably smallest possible, thermal expansion is preferably selected for the carrier element. In particular, copper, silicon, SiC, molybdenum alloys, tungsten alloys or high-grade steel are suitable here as material. The carrier element can internally also have so-called heat pipe structures, which support the internal heat transfer by means of convection effects in order to transport the heat even more efficiently, i.e. with an even smaller temperature gradient. Other electrical elements, in particular electronic circuits, can be linked into the cone carrier; they realize for example a signal conversion for driving the mirror elements and/or the temperature detection.

The seat section, as described above, is preferably formed in a conical or cone-like fashion. The cone angle can be set, if desired, so as to result in a certain self-locking, i.e. the carrier element still does not loosen immediately when the fastening screw is released.

In accordance with a further aspect of the present disclosure, the problem indicated in the introduction is also solved according to the disclosure by means of a method for dissipating heat from the region of a mirror arrangement including a plurality of mirror elements, in which the heat arising at the mirror elements is firstly tapped off by a carrier element and is guided into the region of a mount arrangement, wherein a cooling medium is guided in the mount arrangement in a region adjacent to the carrier element and the heat flow flowing away from the carrier element is tapped off via the cooling medium.

The throughput of the cooling medium and the inlet temperature of the cooling medium are preferably coordinated in terms of control engineering in such a way that the mirror mount attains a predefined setpoint temperature. For this purpose, preferably, the return temperature of the cooling medium is detected and the throughput of the cooling medium is coordinated with recourse to the return temperature.

The thermal coupling of the carrier element in the mount arrangement is preferably achieved by virtue of the fact that a conically fashioned section of the carrier element is forced into a complementarily conically fashioned hole in the mount arrangement and is secured there in intimate contact with the mount arrangement.

The carrier element and the mount arrangement can advantageously be formed in a manner coordinated with one another in such a way that the rotational position of the carrier element in the mount arrangement is precisely defined. Those structures which define the rotational position can be fashioned such that the rotational position is already precisely defined before the end position is reached, in such a way that a carrier element is prevented from contacting already mounted mirror elements in the context of the insertion of the carrier element. The structures for ensuring a correct alignment about the insertion axis can be fashioned such that they remain in the overall system, that is to say are provided by geometrical structures of the carrier elements and of the mount arrangement. They can also be provided by mounting aids which are only used temporarily and which are centred and oriented with respect to other, geometrically sufficiently precisely processed sections of the mount arrangement and are removed after mounting.

A water-containing mixture, an electrically non-conductive medium, glycol, a gas or gas mixture, for example $CO_2$ or a $CO_2$-containing gas mixture, can advantageously be used as cooling medium. The flow of the cooling medium through the cooling circuit is preferably constrained by way of a forced circulation, e.g. by means of a pump device. Numerous adjusting means, in particular restrictor structures, can be provided in the cooling circuit; they make it possible to coordinate the through-flow of the mount arrangement with the local heat input to be expected in the region surrounding the respective carrier element. The cooling circuit can be fashioned such that it includes a multiplicity of branching and combining locations via which the flow of the cooling medium is divided among the respective heat input zones. The arrangement can also include a plurality of pumps, the conveying capacity of which can preferably be coordinated individually.

The mirror arrangement can further advantageously be constructed in such a way that by means of the mount arrangement a multiplicity of mirror elements are arranged to form a mirror surface which is presented as a planar or curved, in particular spherically curved, surface. The mirror elements arranged on the carrier elements can advantageously have a polygon-like, in particular square, rectangular, rhombic, hexagonal, round or elliptic outer contour. Adjacent mirror elements can also have different edge contours which, however, are preferably adjacent complementarily with the smallest possible intermediate gaps. It is also possible to form a largest possible part of the mirror surface to be formed with the use of mirror elements fashioned as similarly as possible and then to insert in specific zones specially shaped mirror elements which then make it possible to comply with specific geometrical special conditions.

In accordance with a further aspect of the present disclosure, it is also possible to form the mount arrangement in such a way that, for a specific number of carrier elements to be arranged adjacently, insertion directions arise which allow a plurality of carrier elements to be combined beforehand to form a group. With the use of mirror elements having hexagon-like contours, by way of example, seven carrier elements can then be combined to form a module group having carrier elements connected to one another beforehand and can be mounted as a prepared group. This simplifies mounting and additionally reduces the risk of damage to the edges of the mirror elements. These prepared groups can have an optically passive, if appropriate, protective enclosure that is as narrow as possible. The carrier elements combined to form a group in this way can be connected to one another in particular materially, for example by welding or soldering, and in this combined form can already ensure a correct optical alignment of the mirror elements.

The mount arrangement can advantageously be produced as a complex integral structural component in the course of a laser fusion method. In this case, it is possible, in particular, to realize the mount arrangement in such a way that the mount arrangement including those wall sections extending around the seat sections of the carrier elements is produced from one piece in the course of the laser fusion method. Insofar as the above-described bush elements receiving the seat sections of the carrier elements can be produced as components that are initially separate from the mount arrangement, they can likewise advantageously be produced in the course of a laser fusion method. In this case, the bush elements can be fashioned such that they have in each case a cooling channel running in the in particular hollow-cone-like lateral surface of the bush element along a spiral path, for example.

The disclosure relates to a thermally highly loaded mount having cooled cone receptacles for a large number of specially fashioned mirror carriers, in particular for a microlithographic exposure apparatus. According to the disclosure, a large number of mirror elements are received in each case by means of a cone carrier in a cooled mount and are positioned with respect to one another by means of the mount. A rotation can be supported by means of the above-mentioned rotation securing means. Each mirror element is carried by a cone carrier and conducts a high thermal load with low thermal resistance into the cooled mount or into the cooling medium. The cone receptacles simultaneously position the mirror elements within the mount. Each mirror element including its cone carrier can be exchanged, without the cooling circuit being opened. The mirror element is fastened on the cone carrier. The connection between mirror element and cone carrier can be implemented by e.g. welding, soldering, adhesive bonding, etc. The cone carrier is formed in such a way that it constitutes a part having good thermal conductivity and adapted, preferably low, thermal expansion. The cone carrier preferably consists of materials in the range of good thermal conductivity and targeted thermal expansion such as, for example, copper, silicon, SiC, molybdenum alloys, tungsten alloys, high-grade steel and the like. The cone carrier can also be formed as a heat pipe in order to conduct heat even more efficiently. Electrical elements can also be integrated into the cone carrier. The mount cooled according to the disclosure carries the cone carriers with the mirror elements fastened thereon. The mount preferably consists of high-grade steel. Alternative materials such as copper, aluminium alloy, Invar, SiC, molybdenum alloys, tungsten alloys, etc., are also suitable, in principle, as materials for producing the mount (if desirable e.g. owing to expansion considerations/thermal engineering considerations, strength considerations, natural frequency considerations, etc.). The cooled mount is simultaneously embodied as a cooler. A cooling medium flows through it and it dissipates the thermal energy transmitted to the mount via the cooling medium. The mount is preferably produced as a soldering assembly and consists of at least two parts of relatively large design (front and rear plates) and a large number of cone sleeves. These components are preferably soldered in a completely vacuum-tight manner. The cone sleeves preferably soldered in are cooled in parallel. The supply hole of each cone sleeve can be formed as a restrictor in order to set the amount of cooling. The mount can, if appropriate, also be produced from one piece (e.g. by a laser fusion method). This internally coolable mount constructed in this way can be linked to an overall holder that makes it possible to achieve a termination of the lower plate carrying the cone carriers.

The mount design according to the disclosure and the specific construction of the cone carriers (in some instances also designated hereinafter as carrier elements) can realize the following system properties:

1. An exchangeability of the mirror elements within the mount is possible, without the cooling circuit having to be opened.
2. A very low thermal resistance is achieved between mirror element connection surface (at the cone carrier) and the cooling medium (in the mount).
3. Large quantities of heat can be dissipated via the cone carrier, particularly if the latter is produced from copper.
4. Only low tightening forces for precisely fastening and holding the cone carriers are involved.
5. The cone shape enables an axially true, intimate force-locking connection.

6. Current- and signal-carrying connection elements can be led through the central opening (hole) in the cone carrier.
7. The liquid-cooled cone sleeves soldered into the mount enable a particularly low thermal resistance since the cooling liquid flows through them directly along the cone shape. The through-flow preferably takes place beginning from the side with the large cone diameter.
8. All cone sleeves soldered in are cooled in parallel from the supply channels.
9. The feed hole for each cone sleeve can differ in its diameter and act as a restrictor.
10. The cone shape enables a large heat transfer area and leads to very good heat transfer in conjunction with an accurate fit. An additional suitable coating on the cone surface leads to further improvement in the heat transfer.
11. This design enables the through-flow of the cooling circuit with at least predominantly laminar flow, as a result of which vibration excitations resulting from the flow of the coolant can be reduced.

BRIEF DESCRIPTION OF THE FIGURES

Further details and features of the disclosure are evident from the following description in association with the drawing, in which:

FIG. 7b shows a further axial sectional illustration for elucidating the installation position of a plurality of carrier elements in a mount arrangement according to the disclosure, with implementation of the sealing concept elucidated in FIG. 7a.

DETAILED DESCRIPTION

Figure 1:
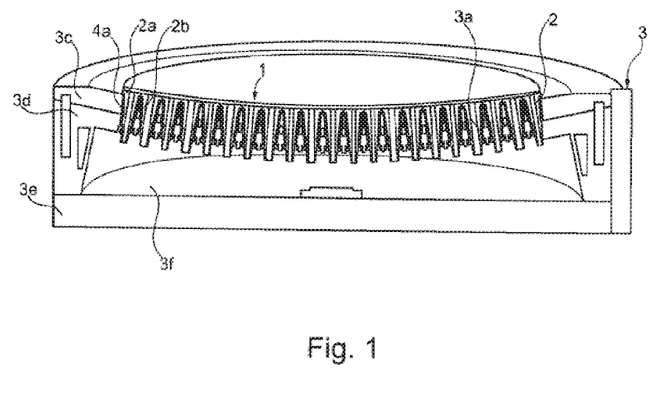
FIG. 1 shows a perspective illustration of a mirror arrangement according to the disclosure including a multiplicity of mirror elements respectively forming mirror arrays.

The illustration in accordance with FIG. 1 elucidates the construction of a mirror arrangement according to the disclosure. The mirror arrangement here includes a multiplicity of mirror elements 1 which are arranged in close proximity, form a concave surface and in this case are aligned towards an optical centre. Each of the mirror elements 1 serves for reflecting electromagnetic radiation and includes a correspondingly reflectively coated mirror surface for this purpose. The mirror arrangement furthermore includes a plurality of carrier elements 2, each including a head section 2a, which is provided for receiving at least one mirror element 1, and also a seat section 2b. Furthermore, the mirror arrangement includes a mount arrangement 3 for receiving the carrier elements 2.

A number of insertion openings 3a corresponding to the number of carrier elements 2 are formed in the mount arrangement 3. In this case, the mirror arrangement is formed in such a way that the seat section 2b of each carrier element 2 plunges into the insertion opening 3a, wherein a channel device 4a for guiding a heat transfer medium is formed in the mount arrangement 3 in the region surrounding the seat section 2b. Via the channel device 4a integrated into the mount arrangement, the heat flow flowing via the seat section 2b of the respective carrier element 2 can be picked up and dissipated in direct proximity to the insertion opening 3a. This makes it possible reliably to keep the mirror elements 1 at a predefined thermal level and also to comply with a predefined thermal setpoint state in a narrow tolerance range for the mount arrangement 3.

In the case of the mirror arrangement illustrated, each mirror element 1 is thermally coupled to a cooled mount via a respective carrier element 2. Each carrier element 2 transfers with low thermal resistance the thermal power emitted by the respective mirror element 1 into the cooled mount 3. Within the mount 3, heat is tapped off by a cooling medium, in particular a cooling liquid. The carrier elements 2 fashioned as cone pins position the mirror elements 1 on the mount 20. Each mirror element 1 in conjunction with the carrier element 2 assigned thereto can be removed from the mount 3 and, if appropriate, exchanged, tested or maintained, without the liquid cooling circuit being opened in the process.

The mount arrangement 3 is of multipartite construction, as discernible. It includes a multiplicity of bush elements 3b fashioned in a hollow-cone-like manner (cf. FIG. 2) and also a plurality of mount shells 3c, 3d, 3e joined together in a stacked manner. The topmost mount shell 3c in the stack and, if appropriate, the subsequent mount shell 3d adjacent thereto forms or form in interaction with the bush elements 3b those cooling channels which cause heat to be tapped off from the region surrounding the seat section 2b of the respective carrier element 2. The second mount shell 3d joined to that topmost mount shell 3c forms, together with the topmost mount shell 3c, a channel system for realizing the fluid supply and fluid discharge. The third mount shell 3e joined in turn to that second mount shell 3d terminates a spatial region 3f extending below the end sections of the carrier elements 2. The third mount shell 3e can be opened and seals the spatial region 3f by means of one or a plurality of seals.

Figure 2:
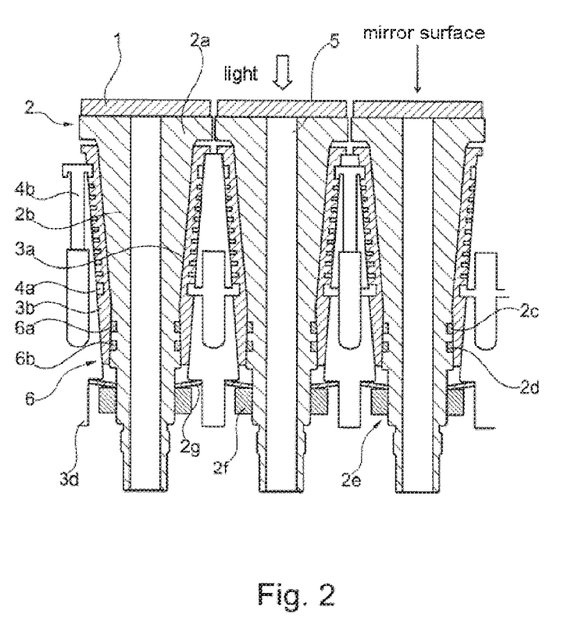
FIG. 2 shows a simplified sectional illustration for elucidating the construction of the mirror arrangement according to the disclosure.

The illustration according to FIG. 2 elucidates by way of example the anchoring of mirror elements 1 on a mount arrangement 3. As evident from the detail illustration found in FIG. 2, the respective carrier element 2 is formed as a pin-like component and the seat section 2b is fashioned conically in a cone-like manner in such a way that it tapers in the insertion direction. A passage channel 5 is formed in the respective carrier element 2, the passage channel extending through the head section 2a and the seat section 2b.

The inner wall of the insertion opening 3a is formed by a bush element 3b linked into the mount arrangement 3. In this case, the bush element 3*b* is linked, preferably soldered, into the mount arrangement 3 in a sealing manner and defines a channel system. The channel guidance is implemented such that the carrier element 2 can be withdrawn from the bush element 3*b* without the cooling circuit being opened. In other words, the cooling circuit is closed independently of the installation state of the carrier elements 2 and can be checked for tightness in this case in particular even before the mounting of the carrier elements 2.

The bush elements 3*b* illustrated here are formed in each case as hollow cone bushes. The channel device 4*a* provided for guiding the cooling medium in or along the bush elements 3*b* is formed at least in sections by a cutout extending in the region of the outwardly facing outer side of the bush element 3*b* in the bush element 3*b*.

A channel system 4*b* is formed in the mount arrangement 3, the channel system 4*b* communicating with the channel device 4*a* provided on the part of the bush element 3*b*. In the exemplary embodiment illustrated, the fluid is guided in such a way that the fluid flows into the thermally more highly loaded region of the carrier element 2 and the fluid discharges from the cooler region—the lower region in this illustration—of the carrier elements 2. As will be explained in even greater detail below, the channel device 4*a* formed in the outer region of the bush element 3*b* is fashioned such that the channel device extends around the bush element 3*b* multiply in the manner of a single- or multi-start thread and the heat transfer medium thus flows intimately around the bush element 3*b*.

The respective carrier element 2 is inserted into the bush element 3*b* in a sealing manner. In order to support the sealing effect, in this case sealing devices 6 are provided in the base region of the seat section. The sealing devices are realized here by O-rings 6*a*, 6*b* seated in corresponding O-ring grooves 2*c*, 2*d* of the carrier elements 2.

The carrier element 2 is provided with a fixing section 2*e*, wherein a holding force that secures the carrier element 2 in the mount arrangement 3 is introduced into the carrier element 2 via the fixing section 2*e*. A nut 2*f* bearing an internal thread engages here on the fixing section 2*e*. The nut is supported by means of a disk spring 2*g* on the second mount shell 3*d*.

Figure 3:
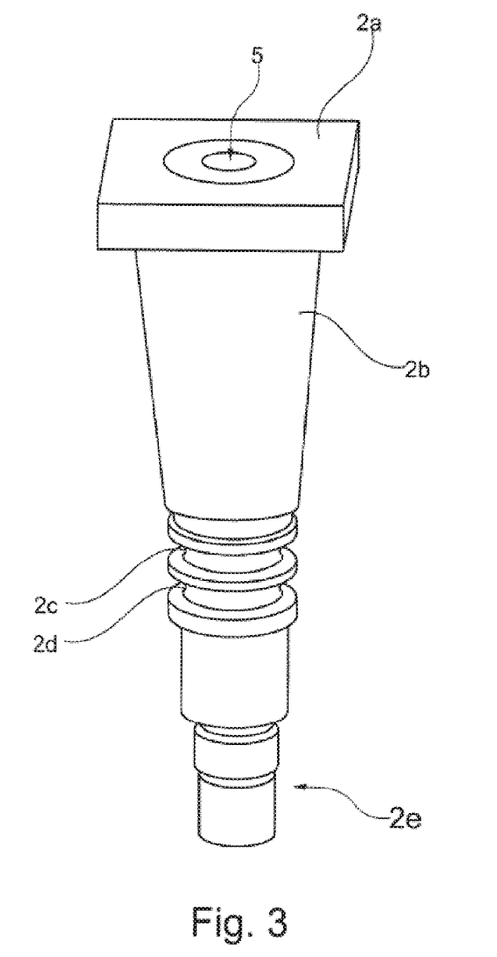
FIG. 3 shows a perspective illustration of a carrier element with a view of the conically fashioned seat section thereof, and of the parallelepiped-like head section provided for receiving the mirror element.

The illustration according to FIG. 3 elucidates one exemplary construction of a carrier element 2 in the form of a perspective illustration. The carrier element 2 is produced as a rotationally symmetrical turned part with regard to its seat section 2*b*. The head section 2*a* is produced here as a parallelepiped-like section and with its end face facing away from the seat section 2*b* forms a contact surface for making planar contact with a mirror element (not illustrated any further here) placed onto this seat surface. However, the head section 2*a* can in particular also have a square, rectangular, hexagonal, rhombic, trapezium-shaped or other, in particular polygonal, outer contour. Preferably, the edge contour of the head section 2*a* corresponds to the edge contour of the mirror element seated thereon. If appropriate, the edge contour can be dimensioned in such a way that the head section projects laterally slightly beyond the edge contour of the mirror element seated thereon, such that, as a result of the corresponding oversize of the head sections of adjacent carrier elements, a direct physical contact between the mirror elements seated on these adjacent head sections is avoided. The seat section 2*b* is produced as a cone structure and is adjacent to a cylindrical section, in which those grooves 2*c*, 2*d* provided for receiving O-rings extend. A threaded pin section 2*e* is situated in the lower region of the carrier element. The carrier element 2 is permeated by an axial hole 5 over its entire length. It is possible to form a local channel system (not discernible in further detail here) in the carrier element 2 and to fill a heat transfer fluid into the channel system in order to support the heat transfer from the region of the head section 2*a* into the region of the seat section 2*b*. The heat transfer medium, the filling quantity and the internal pressure in the channel system can be coordinated so as to result here in a so-called "heat pipe system" in which the heat transfer is supported in association with a change in the state of matter of the heat transfer medium introduced into the local channel system of the carrier element.

Figure 4:
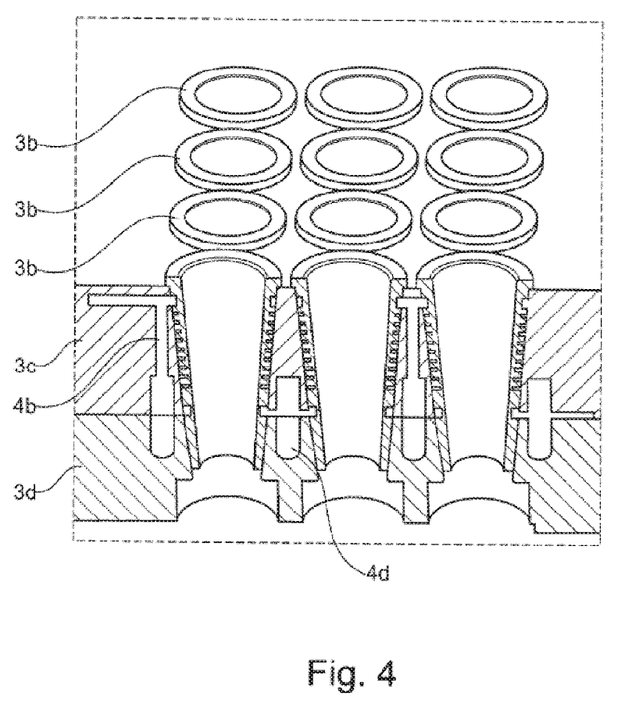
FIG. 4 shows a perspective detail illustration of the mount arrangement with a view of the bush elements provided for forming the near-hole cooling channels.

The illustration according to FIG. 4 shows an excerpt from a mount arrangement according to the disclosure for further elucidation of the cooling fluid channel structures realized in this case. The supply channels provided for feeding fluid and discharging fluid are formed by the topmost mount shell 3*c* and the adjacent second mount shell 3*d*. The fluid guidance is chosen here such that, via the feed channels 4*b*, fluid is fed to that region of the corresponding bush element 3*b* which is adjacent to the mirror elements 1 (cf. FIG. 1). Fluid discharges from the axially remote lower region—reduced with regard to diameter—of the bush element 3*b* via the channel 4*d*. In the case of the exemplary embodiment illustrated here the two mount shells 3*c*, 3*d* and the bush elements 3*b* are produced from a high-grade steel material and soldered to one another using a nickel base solder. The bush elements 3*b*, after their linking into the two mount shells 3*c*, 3*d* forming the mount arrangement, in the region of their inner wall, are reworked again in a material-removing manner, in particular are ground or abraded by means of an axially controlled machining device, in order to ensure a correct geometrical position of the inner wall. For this purpose, the bush elements 3*b* can initially be produced with an oversize on the inner side.

Figure 5:
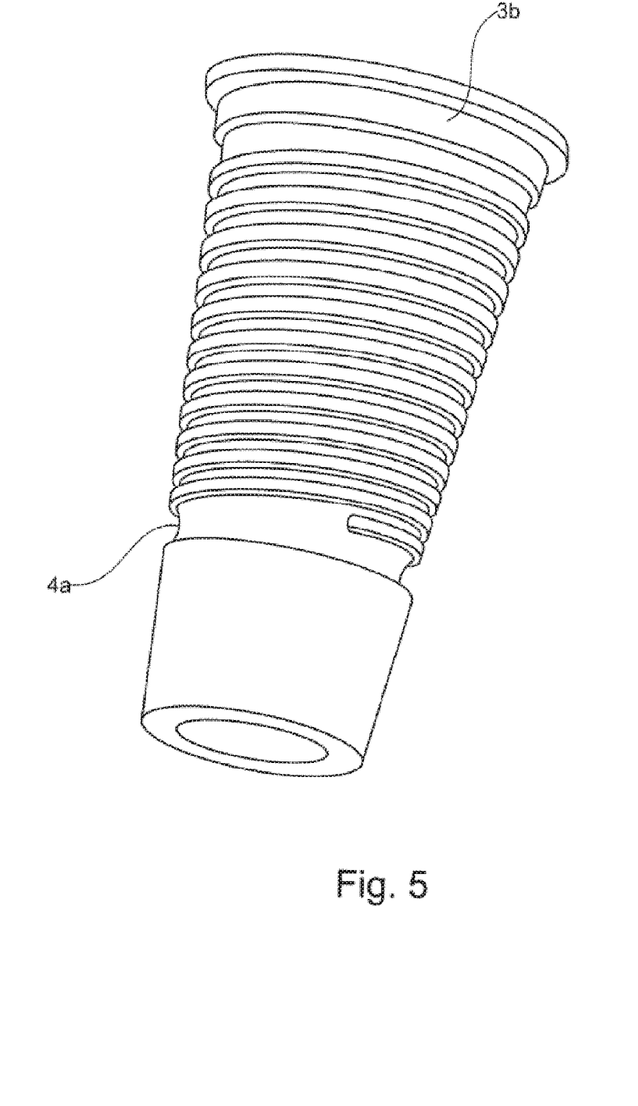
FIG. 5 shows a perspective detail illustration of one preferred configuration of a bush element with two cooling channels formed therein and running in a thread-like manner.

The illustration according to FIG. 5 elucidates the construction of a bush element 3*b* with exterior channel structure 4*a*. The bush element 3*b* is produced as a cone bush. In this case, the channel structure 4*a* can be formed in a material-removing manner in a main body initially produced as a smooth hollow cone. The channel structure 4*a* has a rectangular cross section here in a sectional plane aligned transversely with respect to the through-flow direction and extends in the manner of a multi-start thread in the outer region of the bush element 3*b* in the manner discernible here.

Figure 6:
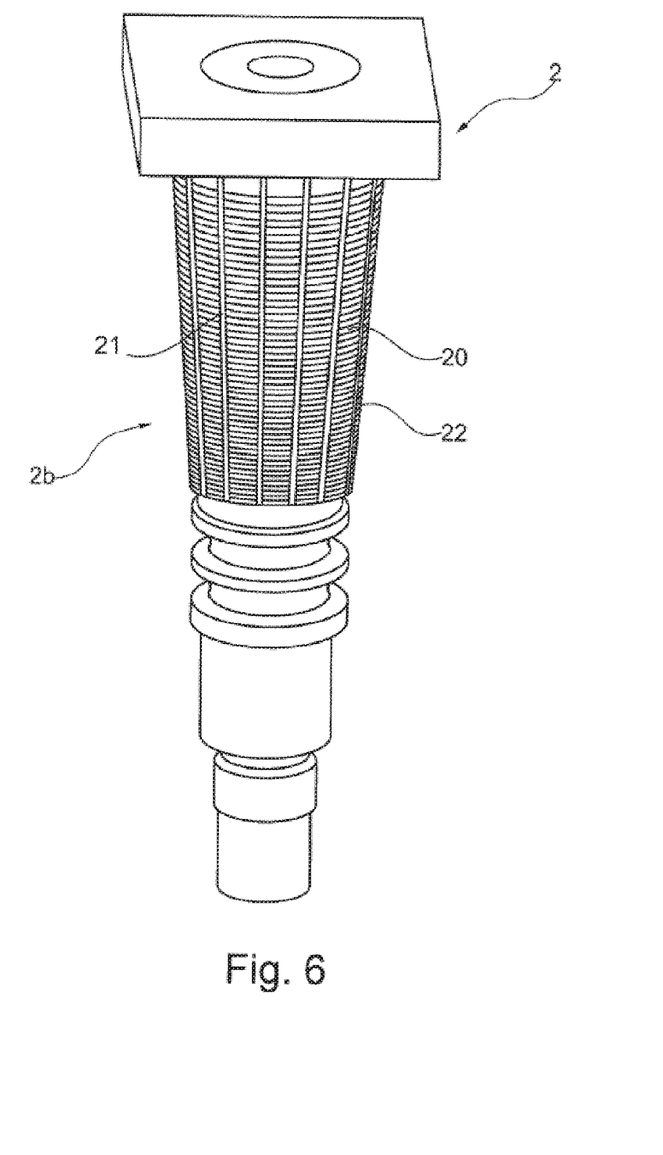
FIG. 6 shows a perspective illustration of a further variant of a carrier element according to the disclosure with a view of the conically fashioned seat section thereof, which here is equipped with a multiplicity of tongue elements.

The illustration according to FIG. 6 elucidates a further exemplary construction of a carrier element 2 in the form of a perspective illustration. The carrier element 2 is produced as a primarily conical turned part with regard to its seat section 2*b*, but is reworked further in this region in such a way that a multiplicity of respectively elastically or plastically deformable contact tongues 20 arise there. The contact tongues 20 are separated from one another by longitudinal grooves 21 and circumferential grooves 22 that are arranged in close proximity to one another. The circumferential grooves 22 are fashioned in a conical-ring-like manner. The contact tongues 20 form in their entirety a fir tree structure, the tongues 20 of which, during incorporation into an assigned insertion opening, are braced against the inner wall of the insertion opening and contact the latter intimately in the process. It is possible for the spaces formed by the longitudinal grooves 21 and the circumferential grooves 22 to be filled with a ductile metal, in particular indium. For the rest, the explanations concerning FIG. 3 hold true analogously.

Figure 7A:
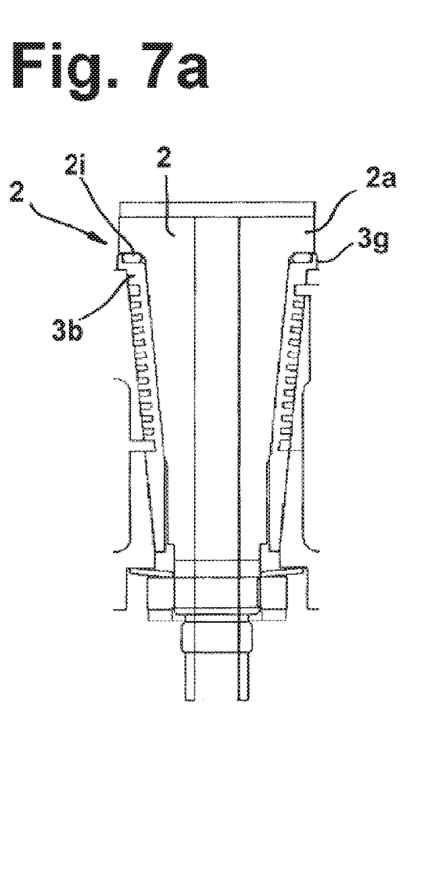
FIG. 7a shows an axial sectional illustration for elucidating the installation position of a carrier element in a mount arrangement according to the disclosure, wherein a sealing arrangement is provided in a region between the underside of the head section of a carrier element and an upper edge region of a bush element receiving the carrier element.

For the exemplary embodiment illustrated in FIG. 7a, the explanations concerning FIGS. 1 to 5 hold true analogously. As a development of the system described in association with FIGS. 1 to 5, a sealing device 2h is provided here in an intermediate region between the head section 2a of the carrier element 2 and an upper edge region of the bush element 3b, by means of which sealing device the carrier element 2 is sealed in a gas-tight manner relative to the mount arrangement 3. The sealing device 2h includes a sealing ring element 2i. In this variant, the sealing ring element 2i is axially loaded and correspondingly deformed. A mount edge 3g is formed on the bush element 3b and encloses the sealing ring element 2i, and the sealing ring element 2i is thereby reliably positioned on the bush element 3b, as a result of which the mounting of the carrier element 2 is facilitated.

Figure 7B:
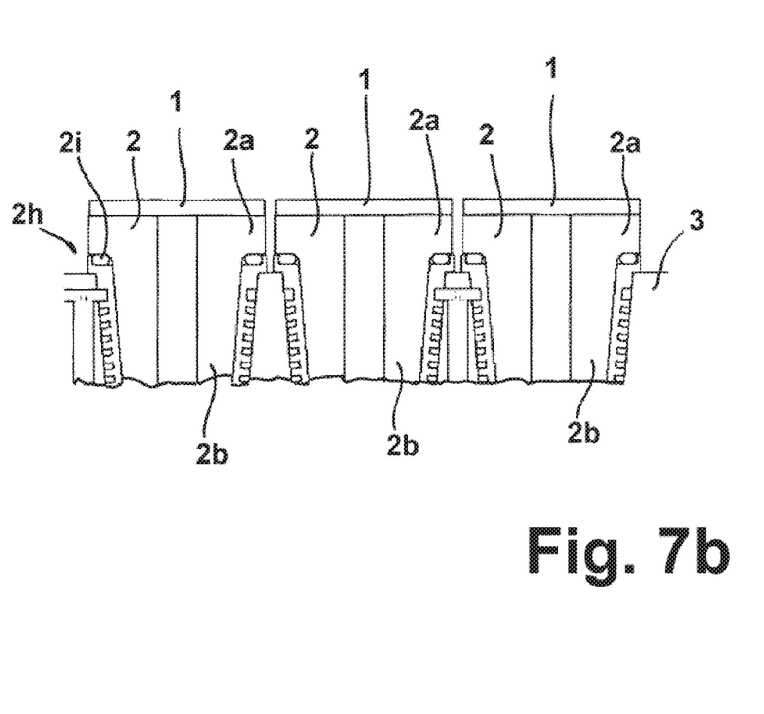

As is evident from the illustration according to FIG. 7b, a plurality of carrier elements 2 can be installed in close proximity in a mount arrangement according to the disclosure. In the case of the exemplary embodiment shown here the head sections 2a are fashioned in such a way that a gap region remains between adjacent head sections 2a. The head sections 2a are furthermore fashioned in such a way that they project in a lateral direction slightly beyond the side wall of the mirror elements 1 mounted on the head sections 2a. A certain protection of the mirror elements 1 is achieved as a result. The gap between the head sections 2a as shown here allows the carrier elements 2 to be mounted with the use of an enclosure surrounding the circumferential edges of the respective head section, and allows this enclosure then to be withdrawn after mounting has been carried out. A cover that covers the mirror facets can also be fitted to the enclosure. A sealing arrangement 2h is provided in the region of the underside of the respective head section 2a, which sealing arrangement corresponds in its construction to the sealing arrangement described above in association with FIG. 7a. Reference is made to the explanations concerning FIG. 7a in this regard. Although not illustrated here, it is possible to combine a plurality of adjacent carrier elements 2 to form a relatively rigid, if appropriate largely preassembled structural unit, such that the carrier elements 2 are linked into the mount arrangement 3 in groups. This grouping is also possible when the carrier elements are arranged in a manner inclined with respect to one another, as long as the inclination of the longitudinal axes of the carrier elements 2 with respect to one another is smaller than the cone angle of the seat sections 2b of the carrier elements 2.

The configuration of the mount arrangement 3 described above in association with the illustrations according to FIGS. 1 to 5 and also 7a and 7b makes it possible to dissipate heat from the region of a mirror arrangement including a plurality of mirror components by virtue of the fact that the heat arising at the mirror components is firstly tapped off by a carrier element 2 and is guided into the region of a mount arrangement 3, wherein a cooling medium is guided in the mount arrangement 3 in a region adjacent to the carrier element 2 and the heat flow flowing away from the carrier element 2 into the mount arrangement 3 is tapped off via the cooling medium. In this case, the throughput of the cooling medium and the inlet temperature of the cooling medium are coordinated in terms of control engineering. This coordination can be implemented for example in such a way that the return temperature of the cooling medium is detected and the throughput of the cooling medium is coordinated with recourse to the return temperature. The throughput of the cooling medium and the channel cross sections are preferably coordinated such that a possibly laminar flow as free of turbulences and cavitations as possible arises in the mount arrangement. This prevents possible mechanical vibrations caused by the cooling medium from impairing the imaging properties of the mirror arrangement formed with inclusion of the mirror elements.

The disclosure has been explained in greater detail above on the basis of various exemplary embodiments and modifications. In particular, technical individual features explained above in the context of further individual features can be realized independently thereof and in combination with other individual features, specifically even if this is not expressly described, as long as this is technically possible. Therefore, the disclosure is expressly not restricted to the exemplary embodiments described, but rather encompasses all embodiments defined by the patent claims.

What is claimed is:

1. A mirror arrangement, comprising:
   a mirror element bearing a mirror surface configured to reflect electromagnetic radiation;
   a carrier element comprising a head section and a seat section; and
   a mount arrangement having an insertion opening and a channel device,
   wherein:
   the head section is configured to receive the mirror element;
   the seat section is disposed in the insertion opening;
   the channel device is configured to guide a heat transfer medium on a region surrounding the seat section;
   the carrier element has a passage channel extending through the seat section; and
   the passage channel extends through the head section.

2. The mirror arrangement of claim 1, wherein the carrier element is a pin-like component, and the seat section tapers in an insertion direction.

3. The mirror arrangement of claim 2, wherein the seat section has a conical outer surface.

4. The mirror arrangement of claim 1, wherein an inner wall of the insertion opening comprises a bush element linked into the mount arrangement.

5. The mirror arrangement of claim 4, wherein the bush element is linked into the mount arrangement in a sealing manner.

6. The mirror arrangement of claim 5, wherein the bush element is a hollow cone bush.

7. The mirror arrangement of claim 6, wherein at least sections of the channel device comprise a cutout extending in the region of the outer side of the bush element.

8. The mirror arrangement of claim 7, wherein the channel device is in the outer region of the bush element and extends around the bush element.

9. The mirror arrangement of claim 4, further comprising a channel system in the mount arrangement, wherein the channel system is configured to communicate with the channel device which is provided on a part of the bush element.

10. The mirror arrangement of claim 4, wherein the respective bush element has a cooling channel running running along a spiral path.

11. The mirror arrangement of claim 1, wherein the carrier element is in the bush element in a sealing manner.

12. The mirror arrangement of claim 1, wherein the carrier element comprises a fixing section, and the mirror arrangement is configured so that: a holding force secures the carrier element in the mount arrangement; and the holding force is introduced into the carrier element via the fixing section.

13. The mirror arrangement of claim 1, further comprising a coating composed of a ductile material in a region of the seat section.

14. The mirror arrangement of claim 1, further comprising an elastically and/or plastically deformable lamellar structure in a region of the seat section, wherein the lamellar structure contacts the inner wall of the insertion opening in a manner ensuring a low heat transfer resistance.

15. The mirror arrangement of claim 1, wherein the carrier element comprises a local channel system configured to support the heat transfer from a region of the head section into a region of the seat section in conjunction with a change in the state of matter of a heat transfer medium introduced into the local channel system of the carrier element.

16. The mirror arrangement of claim 1, wherein the carrier element and the mount arrangement are configured to define an orientation of the carrier element about a longitudinal axis of the insertion opening.

17. The mirror arrangement of claim 1, wherein the cooling medium comprises a material selected from the group consisting of water, a water-containing mixture, glycol, a gas, a gas mixture and liquid carbon dioxide.

18. The mirror arrangement of claim 1, wherein a multiplicity of mirror elements are arranged via the mount arrangement to provide a mirror surface.

19. The mirror arrangement of claim 1, wherein the mount arrangement comprises a single laser fused piece.

20. The mirror arrangement of claim 1, wherein the mount arrangement comprises wall sections extending around the seat sections, and the mount arrangement is a single laser fused piece.

21. The mirror arrangement of claim 1, wherein the mirror elements have a polygon-like outer contour.

22. A method of dissipating heat from a region of a mirror arrangement comprising a plurality of mirror elements, the method comprising:

using a carrier element to tap off heat arising at the mirror elements, the carrier element comprising a passage channel extending through a seat section of the carrier element;

guiding the heat into a region of a mount arrangement;

guiding a cooling medium in the mount arrangement in a region adjacent to the carrier element; and using the cooling medium to tap off the heat flowing away from the carrier element into the mount arrangement, wherein:

the mirror arrangement comprises a mirror element bearing a mirror surface configured to reflect electromagnetic radiation;

the carrier element comprises a head section configured to receive the mirror element; and the passage channel extends through the head section.

23. The method of claim 22, further comprising using control engineering to coordinate a throughput of the cooling medium and an inlet temperature of the cooling medium.

24. The method of claim 22, further comprising detecting a return temperature of the cooling medium, and coordinating a throughput of the cooling medium at least partially based on the detected return temperature of the cooling.

25. The method of claim 22, wherein:

the mirror arrangement comprises a mirror element bearing a mirror surface configured to reflect electromagnetic radiation;

the carrier element comprises a head section configured to receive the mirror element; and the passage channel extends through the head section.

26. The mirror arrangement of claim 1, wherein the passage channel extends through the head section.

* * * * *

UNITED STATES PATENT AND TRADEMARK OFFICE
CERTIFICATE OF CORRECTION

PATENT NO. : 10,663,873 B2  
APPLICATION NO. : 15/393702  
DATED : May 26, 2020  
INVENTOR(S) : Willi Heintel and Hermann Bieg Page 1 of 1

It is certified that error appears in the above-identified patent and that said Letters Patent is hereby corrected as shown below:

In the Claims

Column 14, Line 30, Claim 1, after "section;" insert -- and --;

Column 14, Line 32, Claim 1, delete "section; and" and insert -- section. --;

Column 14, Line 33, Claim 1, below "and" delete "the passage channel extends through the head section.";

Column 14, Line 60, Claim 10, before "along" delete "running";

Column 16, Line 9, Claim 22, delete "arrangement," and insert -- arrangement. --;

Column 16, Lines 10-17, Claim 22, below "arrangement," delete "wherein: the mirror arrangement comprises a mirror element bearing a mirror surface configured to reflect electromagnetic radiation; the carrier element comprises a head section configured to receive the mirror element; and the passage channel extends through the head section.".

Signed and Sealed this  
Seventh Day of July, 2020

Andrei Iancu  
*Director of the United States Patent and Trademark Office*